US011146894B2

(12) United States Patent
Brioschi et al.

(10) Patent No.: US 11,146,894 B2
(45) Date of Patent: Oct. 12, 2021

(54) PACKAGING FOR A MEMS TRANSDUCER

(71) Applicant: Cirrus Logic International Semiconductor Ltd., Edinburgh (GB)

(72) Inventors: Roberto Brioschi, Austin, TX (US); Rkia Achehboune, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/823,971

(22) Filed: Mar. 19, 2020

(65) Prior Publication Data
US 2020/0304922 A1 Sep. 24, 2020

Related U.S. Application Data

(60) Provisional application No. 62/822,163, filed on Mar. 22, 2019.

(30) Foreign Application Priority Data

Apr. 29, 2019 (GB) ..................................... 1905924

(51) Int. Cl.
*H04R 19/00* (2006.01)
*H04R 19/04* (2006.01)
*B81B 7/00* (2006.01)
*B81C 1/00* (2006.01)

(52) U.S. Cl.
CPC ........... *H04R 19/04* (2013.01); *B81B 7/0061* (2013.01); *B81C 1/00309* (2013.01); *B81B 2201/0257* (2013.01); *B81B 2207/012* (2013.01); *H04R 2201/003* (2013.01)

(58) Field of Classification Search
CPC .............. H04R 19/04; H04R 2201/003; H04R 2499/11; H04R 19/005; H04R 1/04; H04R 1/342; H04R 31/006; B81B 7/0061; B81B 2201/0257; B81B 2207/012; B81C 1/00309
See application file for complete search history.

(56) References Cited

U.S. PATENT DOCUMENTS

| | | | |
|---|---|---|---|
| 2007/0189558 A1 | 8/2007 | Ogura et al. | |
| 2010/0128914 A1 | 5/2010 | Khenkin | |
| 2016/0165330 A1* | 6/2016 | Minervini | H04R 1/028 374/142 |
| 2016/0277831 A1* | 9/2016 | Manley | H04R 1/342 |
| 2017/0347174 A1* | 11/2017 | Chandrasekaran | H04R 19/04 |

FOREIGN PATENT DOCUMENTS

EP 3018092 A1 5/2016

OTHER PUBLICATIONS

Combined Search and Examination Report under Sections 17 and 18(3), UKIPO, Application No. GB1905924.5, dated Dec. 13, 2019.
Examination Report under Section 18(3), UKIPO, Application No. GB1905924.5, dated Mar. 22, 2021.

* cited by examiner

*Primary Examiner* — Matthew A Eason
(74) *Attorney, Agent, or Firm* — Jackson Walker L.L.P.

(57) ABSTRACT

The present application describes a MEMS transducer package having a substrate layer which defines a recess. The recess extends in the plane of the substrate layer and defines a channel for directing sound waves that are incident on a side surface of the package substrate.

17 Claims, 11 Drawing Sheets ers of acoustic pressure waves to/from the transducer within the package. The trans-
PACKAGING FOR A MEMS TRANSDUCER

TECHNICAL FIELD

This application relates to packaging for a micro-electromechanical system (MEMS) device and to processes for fabricating such packaging. In particular, this application relates to packaging for a MEMS capacitive microphone device and also to packaging processes.

BACKGROUND

MEMS devices are becoming increasingly popular. MEMS transducers, and especially MEMS capacitive microphones, are increasingly being used in portable electronic devices such as mobile telephones, headphones and other portable devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

A MEMS transducer will typically be housed within a package which allows easy handling and assembly and serves to protect the primary substrate and the component supported thereby from e.g. mechanical damage, RF noise and environmental contamination. The package also provides a means—e.g. an external conductive contact—for connecting the package to a circuit board or other elements.

Various packaging configurations are known. For example, a package for a MEMS transducer typically comprises a package substrate, which may be formed of a printed circuit board (PCB) or silicon, and a cover portion which extends in a plane overlying the upper surface of the package substrate supported by side walls. The cover portion and side walls may be provided by e.g. a metallic lid which is attached to the upper surface of the package substrate. Alternatively, the cover portion and the side walls may be formed of two further PCBs. The three PCBs are bonded together wherein the middle PCB comprises an opening which defines the chamber of the package. The MEMS transducer is attached to the upper surface of the package substrate within the chamber.

A package which houses a microphone transducer will typically have a sound port to allow transmission of sound waves to/from the transducer within the package. The transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one or more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials due to temperature changes or the like).

According to known package designs the sound port is provided in the cover portion of the package. In alternative known package designs the sound port is provided in the package substrate.

A packaged microphone transducer may be provided for use in a host device such as a mobile phone or other electronic device. Typically the package substrate is mounted and electrically connected to a host PCB or other substrate of the host device. It is typically necessary to mount a packaged microphone transducer close to a sound port formed in the outer boundary edge or cover of the host device in order to facilitate ingress of acoustic pressure waves (i.e. sound) into the front volume of the microphone transducer. Typically, a member providing a sound channel, e.g. a gasket, is typically interposed between sound port of the transducer package and the sound port provided in the device cover.

In many applications a packaged MEMS transducer will be mounted such that the sound port of the package is at least partially aligned with the acoustic port provided in the device cover. Thus, if the sound port of the package is projected in a direction normal to the sound port onto the plane of the device cover, then the boundary of the sound port will at least partly overlie the acoustic port provided in the device cover. Thus, any interposer member or gasket that provides a channel or conduit for fluid communication between the two sound ports may be generally longitudinal in form.

However, in some applications it may be necessary or advantageous for the MEMS transducer package to be mounted such that the sound port of the package is not aligned with the acoustic port of the device cover. In other words, there is a lateral offset between the acoustic port of the device cover and an orthogonal projection of the sound port of the transducer package onto the plane of the device cover. In this case, according to prior arrangements it has been proposed that a sound channel or gasket defining a more complex form is interposed between the sound port of the package and the sound port of the device. Thus, the sound channel may not define a straight line path between the two ports and may, for example, comprise one or more turns or bends in the path provided by the sound channel in order to direct and channel acoustic pressure waves between the ports.

In circumstances where the acoustic port of a microphone transducer package does not overly the acoustic port of the device cover when viewed in a direction normal to one of the ports, it will be appreciated that a more complex gasket design is required in order to direct or channel sound pressure waves between the two ports. Furthermore, the provision of one or more turning points or bends in the interposer member may render it more prone to folding and/or vulnerable to collapse.

The present examples are directed to the problem of channelling and/or directing acoustic pressure waves between the acoustic port of a device cover and the acoustic port of a microphone package, in particular in circumstances where the two ports are not aligned.

According to a first example of a first aspect there is provided A MEMS transducer package comprising:

a package substrate comprising a cavity which is formed through the package substrate from an upper surface to a lower surface thereof; and a substrate layer which underlies the package substrate, wherein a boundary edge of the substrate layer defines a recess which extends in the plane of the substrate layer and wherein the cavity overlies the recess.

Thus, the recess and the cavity together define a channel for directing sound waves that enter the channel at a mouth region of the recess towards a region directly above the upper surface of the package substrate.

The MEMS transducer package may further comprise a base substrate which underlies the package substrate, wherein the substrate layer is provided on the base substrate.

According to at least one example an upper surface of the substrate layer is provided in contact with the lower surface of the package substrate, wherein a lower surface of the substrate layer is provided in contact with an upper surface of the base substrate.

Thus, a channel may be defined by:
i) the portion of the boundary of the substrate layer which defines the recess,
ii) the lower surface of the package substrate; and
iii) the upper surface of the base substrate.

According to at least one example the recess extends from a mouth region of the recess in a first direction. The mouth region may define a sound port of the transducer package. The sound port may therefore be provided at a side surface of the transducer package.

According to at least one example the MEMS transducer package further comprises a MEMS microphone transducer provided on the upper surface of the package substrate. The MEMS microphone transducer typically comprises a flexible membrane which deflects in response to a pressure differential across the membrane, and wherein the MEMS microphone transducer is provided such that the flexible membrane overlies the cavity of the package substrate.

The MEMS transducer package may further comprise electronic circuitry. The electronic circuitry may comprise an integrated circuitry chip. The integrated circuitry chip may be provided on the upper surface of the package substrate. According to a further example, the integrated circuitry chip is provided between the upper and lower surfaces of the base substrate. Thus, the base substrate may comprise an aperture which extends from an upper surface of the base substrate to the lower surface of the base substrate, and wherein the integrated circuity chip is provided within the aperture. The integrated circuitry chip may be connected to the base substrate by a connecting frame which is formed between the outer boundary of the integrated circuitry chip and the side wall(s) of the aperture. A first electrically conductive path may be provided between the integrated circuitry chip and the upper surface of the substrate layer. A second electrically conductive path may be provided between the upper surface of the substrate layer and the MEMS transducer. The first and/or second electrically conductive path may comprise one or more of: a conductive wire, a conductive via, a conductive redistribution layer.

The MEMS transducer package may further comprise a lid portion, the lid portion being provided on the upper surface of the package substrate to define a chamber. The lid portion may be formed of metal.

According to at least one example of a further aspect there is provided a base substrate comprising a substrate layer formed on an upper surface of the base substrate, wherein a boundary edge of the substrate layer defines a recess which extends in the plane of the substrate layer. The base substrate may further comprise an aperture which extends from an upper surface of the base substrate to the lower surface of the base substrate, wherein a circuitry chip is provided within the aperture. The circuitry chip may be connected to the base substrate by a connecting frame which is formed, e.g. of a moulded epoxy material, between the outer boundary of the integrated circuitry chip and the side wall(s) of the aperture. The base substrate may be formed of a printed circuit board (PCB).

According to a further aspect there is provided an electronic device comprising a MEMS transducer package according to the present examples. The device may comprise a cover, the cover being provided with a sound port and wherein the MEMS transducer package is mounted within the electronic device such that an orthogonal projection of the mouth region of the recess defined by the substrate layer coincides with sound port. The device may be at least one of: a portable device; a battery powered device; an audio device; a computing device; a communications device; a personal media player; a headphone; a mobile telephone; a games device; and a voice controlled device.

According to a further aspect there is provided a method of fabricating a MEMS transducer package according to the present examples.

According to a still further aspect there is provided a method of fabricating a base substrate according to the present examples.

For as better understanding of the present invention, and to show how the same may be carried into effect, reference will now be made by way of example to the accompanying drawings in which:

FIGS. 1a and 1b, which may be collectively referred to as FIG. 1, show a schematic diagram and a perspective view, respectively, of a known capacitive MEMS microphone device;

FIGS. 2a and 2b, which may be collectively referred to as FIG. 2, illustrate previously proposed lid-type packages;

FIGS. 3a and 3b, which may be collectively referred to as FIG. 3, illustrate the relative alignment between a sound port of a microphone package and the sound port of a host device;

Figure 10A:
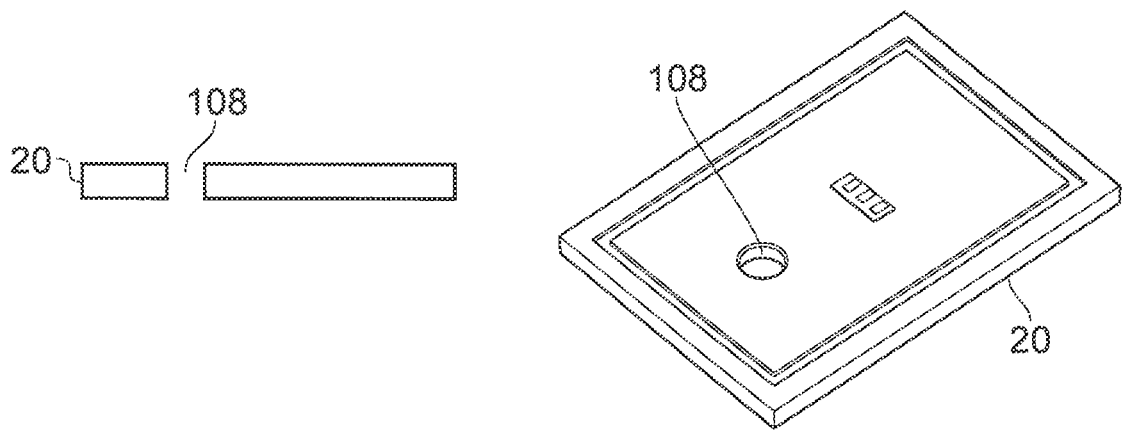
Figure 10B:
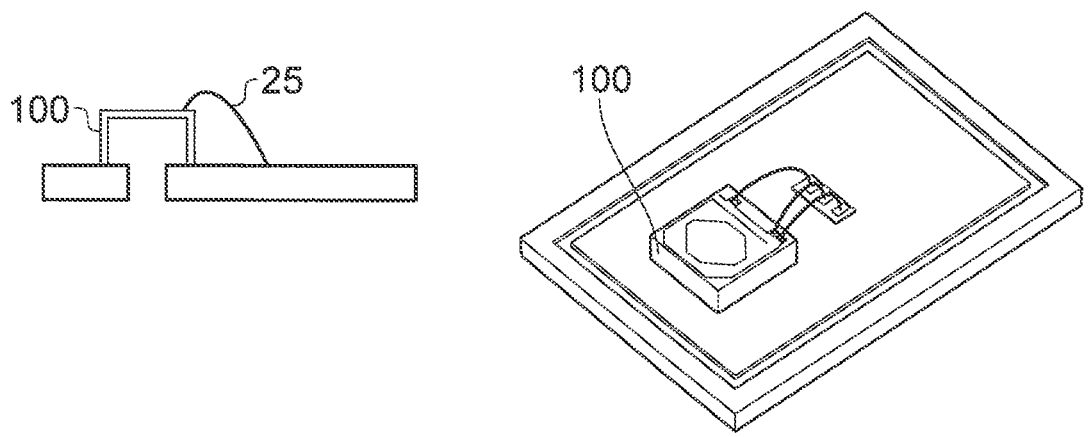
Figure 10C:
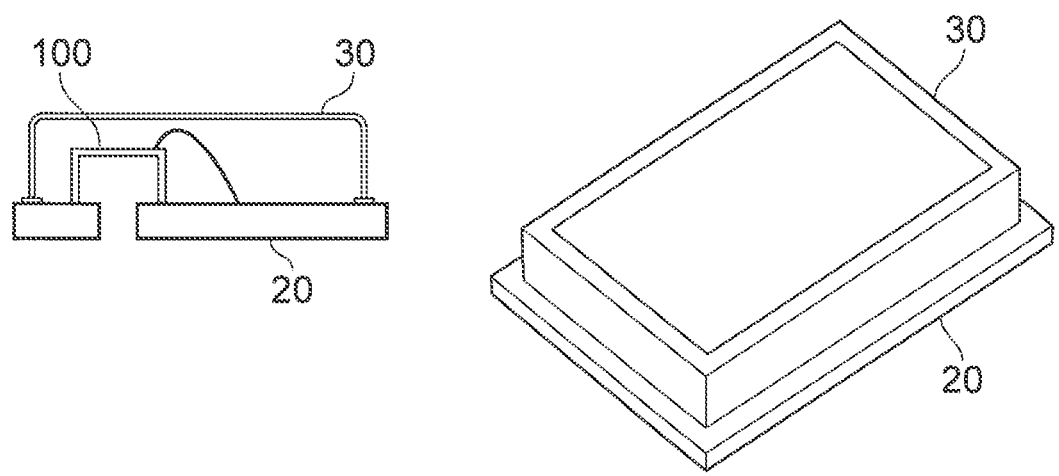
Figure 11:
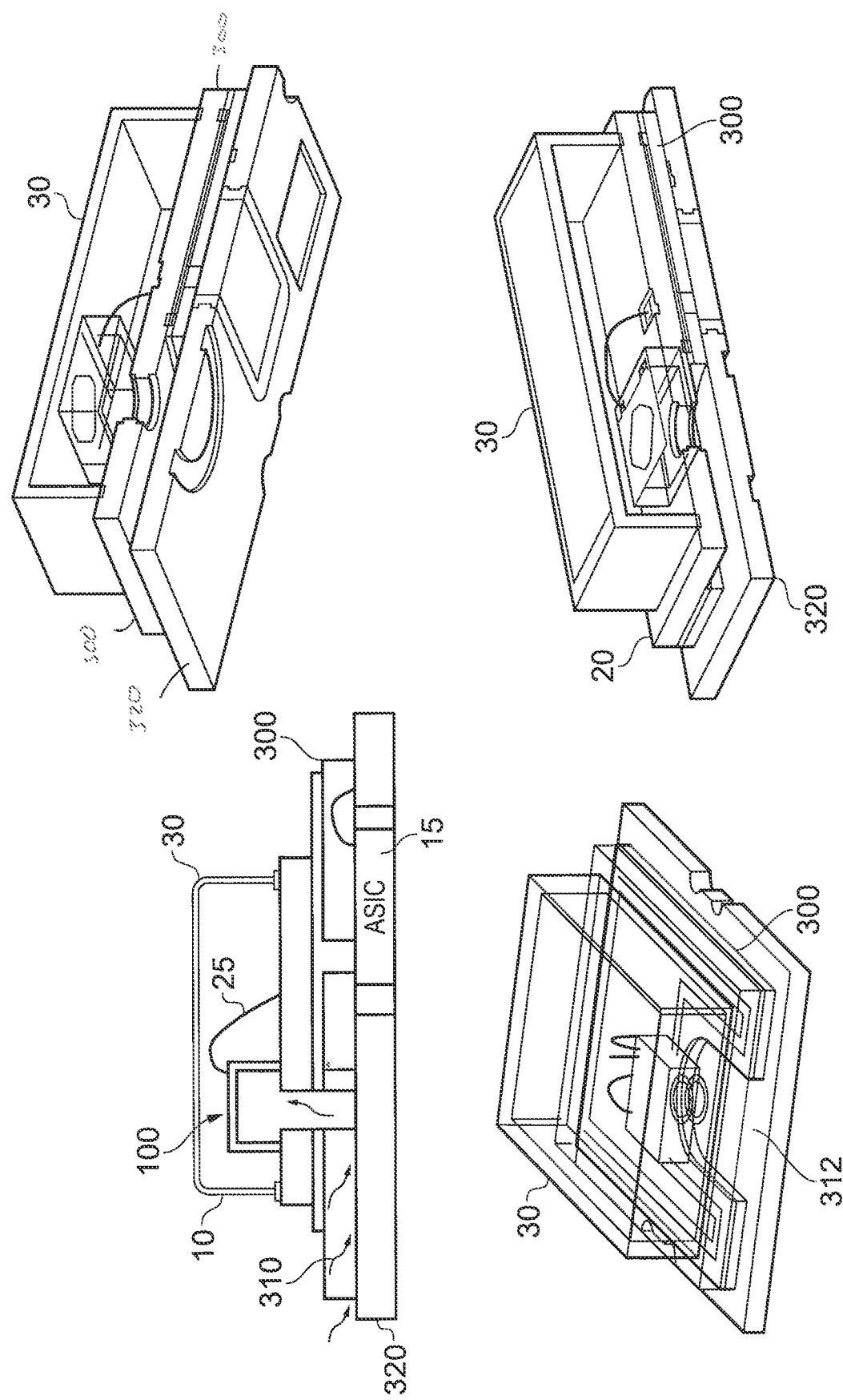
Figure 12:
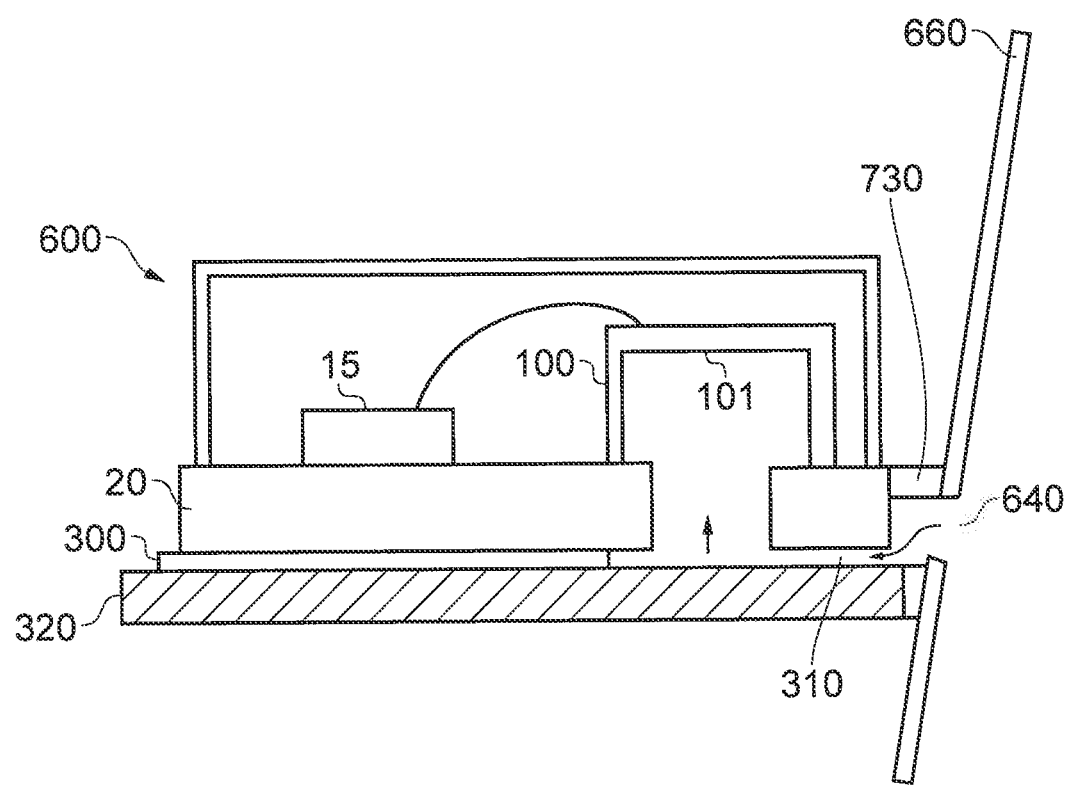

FIGS. 9a to 9f, which may be collectively referred to as FIG. 9, provide a schematic illustration of a method of fabricating a base substrate for a MEMS transducer package;

FIGS. 10a to 10c, which may be collectively referred to as FIG. 10, illustrate a simplified method of fabricating a MEMS transducer package;

FIG. 11 provides various view of transducer package according to one example; and FIG. 12 illustrates a transducer package according to a present example, mounted in a host device.

The description below sets forth examples and arrangements according to this disclosure. Further examples, arrangements and implementations will be apparent to those having ordinary skill in the art. Further, those having ordinary skill in the art will recognize that various equivalent techniques may be applied in lieu of, or in conjunction with, the examples discussed below, and all such equivalents should be deemed as being encompassed by the present disclosure.

The methods described herein can be implemented in a wide range of devices and systems including headphones, audio players, laptops, mobile phones, PDAs, hands-free sets, voice activated or voice-controlled devices and personal computers.

Figure 1A:
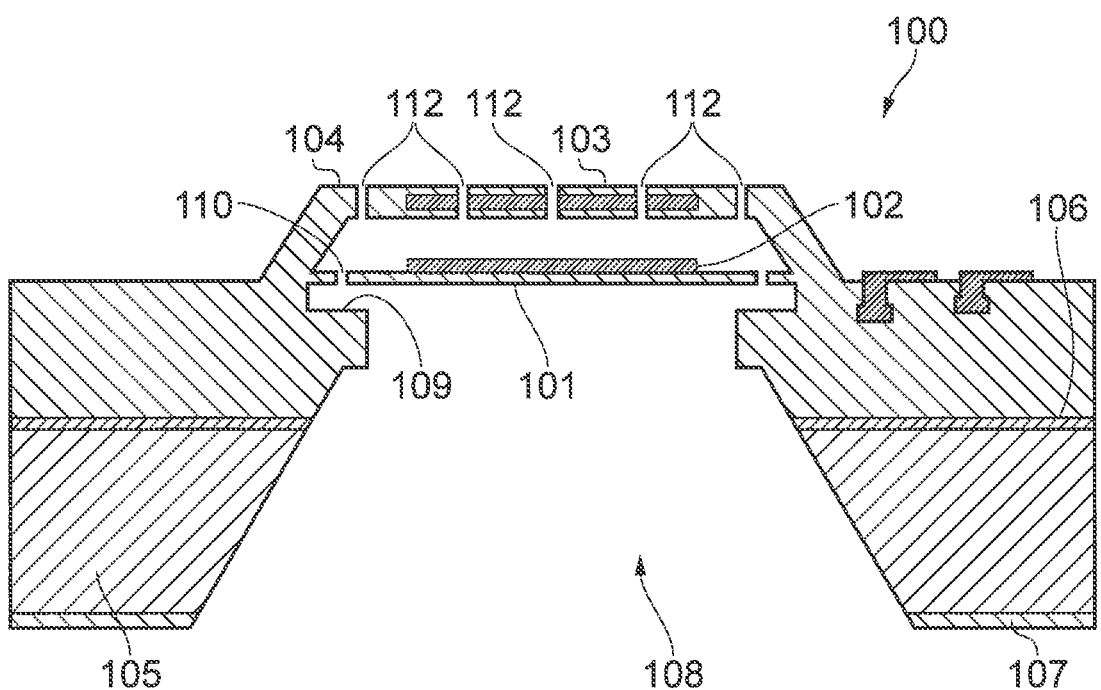
Figure 1B:
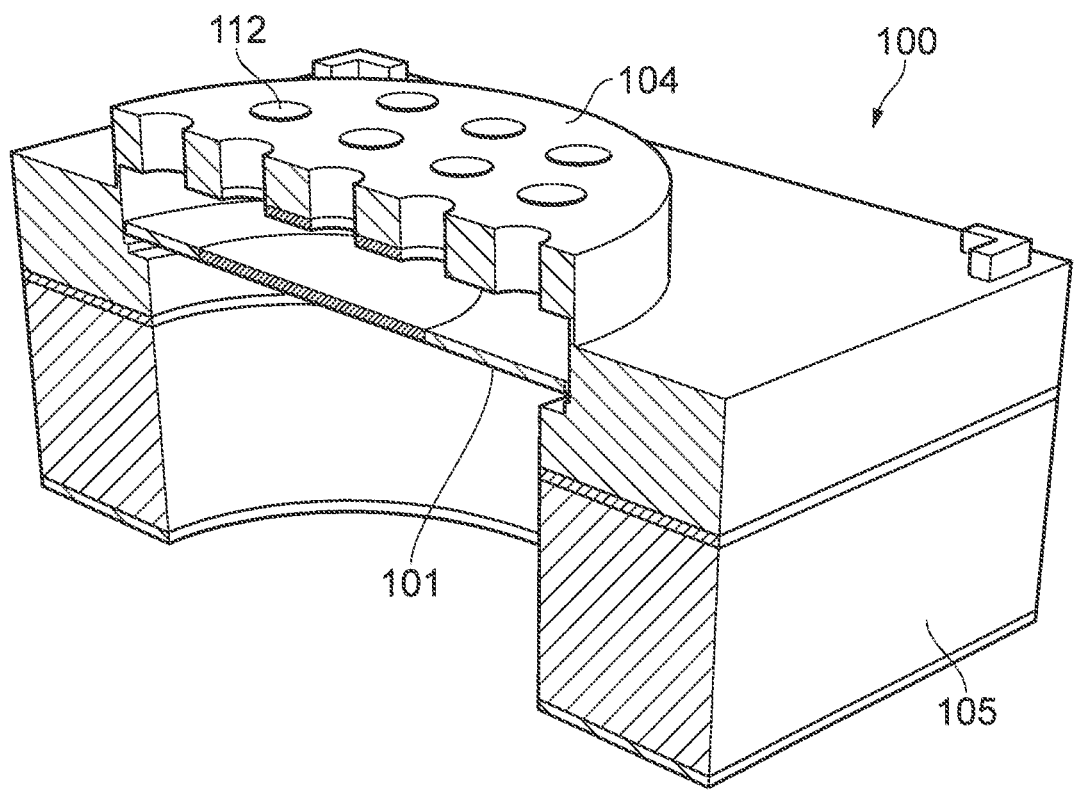

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110. A plurality of holes, hereinafter referred to as bleed holes 111, connect the first cavity 109 and the second cavity 110.

A plurality of acoustic holes 112 are arranged in the back-plate 104 so as to allow free movement of air molecules through the back plate, such that the second cavity 10 forms part of an acoustic volume with a space on the other side of the back-plate. The membrane 101 is thus supported between two volumes, one volume comprising cavities 109 and substrate cavity 108 and another volume comprising cavity 110 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 4 forms part of the back-volume which is typically enclosed by some other structure, such as a suitable package.

It should also be noted that whilst FIGS. 1a and 1b show the backplate being supported on the opposite side of the membrane to the substrate, arrangements are known where the backplate is formed closest to the substrate with the membrane layer supported above it.

In use, in response to a sound wave corresponding to a pressure wave incident on the microphone, the membrane is deformed slightly from its equilibrium or quiescent position. The distance between the membrane electrode 102 and the backplate electrode 103 is correspondingly altered, giving rise to a change in capacitance between the two electrodes that is subsequently detected by electronic circuitry (not shown).

The membrane layer and thus the flexible membrane of a MEMS transducer generally comprises a thin layer of a dielectric material—such as a layer of crystalline or polycrystalline material. The membrane layer may, in practice, be formed by several layers of material which are deposited in successive steps. Thus, the flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located in the centre of the flexible membrane 101, i.e. that part of the membrane which displaces the most. It will be appreciated by those skilled in the art that the membrane electrode may be formed by depositing a metal alloy such as aluminium-silicon for example. The membrane electrode may typically cover, for example, around 40% of area of the membrane, usually in the central region of the membrane.

Thus, known transducer membrane structures are composed of two layers of different material—typically a dielectric layer (e.g. SiN) and a conductive layer (e.g. AlSi).

Figure 2A:
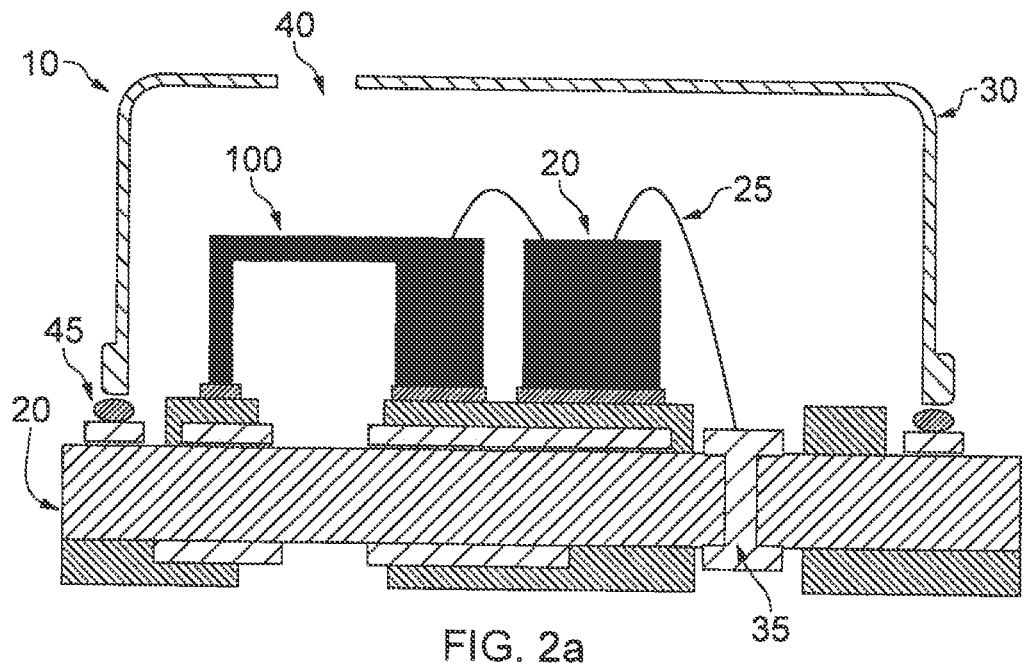
Figure 2B:
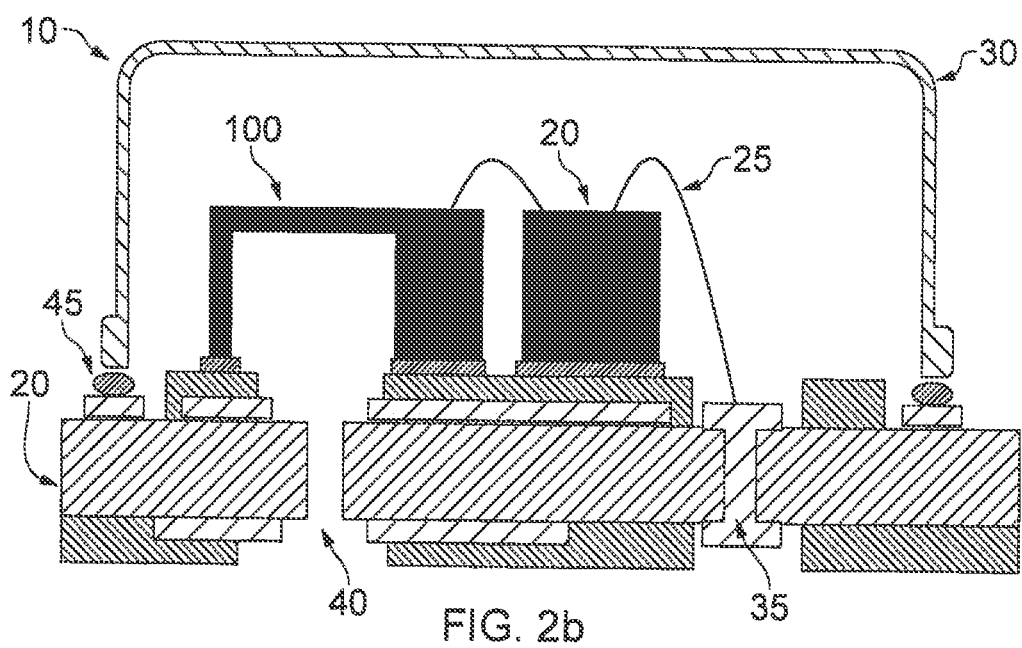

FIGS. 2a and 2b illustrate "lid-type" packages 10. A MEMS transducer 100 is mounted to an upper surface of a package substrate 20. The package substrate 20 may be PCB (printed circuit board) or any other suitable material. A cover or "lid" 30 is located over the transducer 100 and is attached to the upper surface of the package substrate 20 by means of e.g. epoxy resin or solder 45. The cover 30 may be a metallic lid. In FIG. 2a, an aperture 40 in the cover 30 provides a sound port and allows acoustic signals to enter the package. In FIG. 2b an aperture 40 in the package substrate 20 provides the sound port and the MEMS transducer is mounted such that the flexible membrane of the transducer extends over the sound port. According to convention, the configuration shown in FIG. 2a—in which the sound port 40 is provided on opposite side of the package to the external electrical connection 35—is known as a "top port" configuration. The configuration shown in FIG. 2b—on which the sound port 40 is provided on the same side of the package to the external electrical connection 35—is known as a "bottom port" configuration. It will be appreciated that the terms "top port" and "bottom port" do not imply any particular orientation of the package device either during manufacture, processing or any subsequent application.

The package may also contain an integrated circuit 15. The integrated circuit will typically be formed on a die of semiconductor material and will be customised for a particular application. The integrated circuit will be electrically connected to electrodes of the transducer 100 and an electrically conductive path 25 will be provided between the integrated circuit and an electrical connection 35 provided on an external surface of the package. The integrated circuit may provide bias to the transducer and may buffer or amplify a signal from the transducer. It will be appreciated that according to an alternative arrangement (not shown) the integrated circuit may be provided as a monolithic device whereby the electronic circuitry is fully integrated within the same die as the microphone transducer.

Figure 3A:
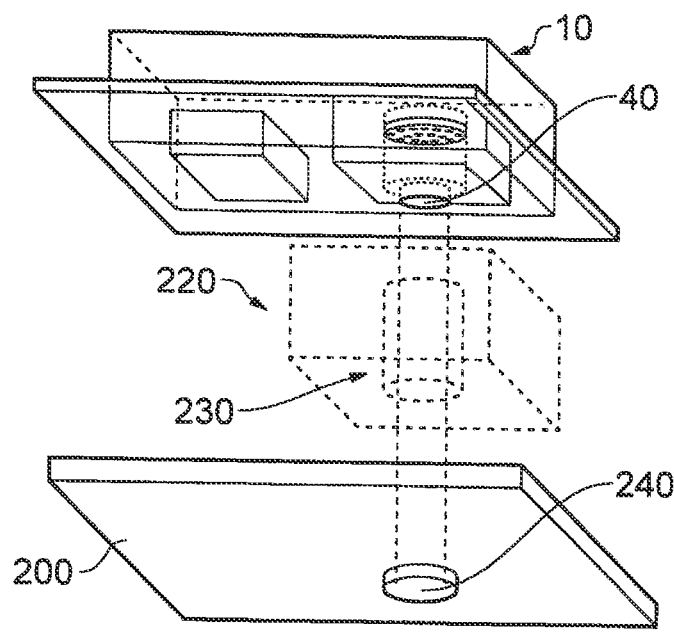
Figure 3B:
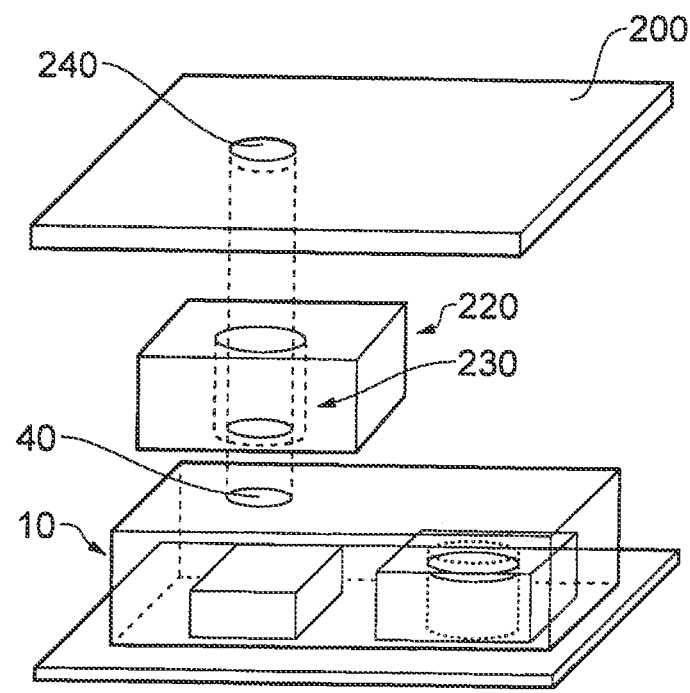

FIG. 3 illustrates the relative arrangement between a sound port 40 of a microphone package 10 and the acoustic port 240 of the device cover 200 in circumstances where the sound ports can be considered to be aligned or mutually overlapping in the sense that the region of the ports will at least partially overlap when considering a perpendicular projection—indicated by dashed lines—of either one of the ports onto the plane of the other port. Specifically, FIG. 3a illustrates the relative alignment in the case of a bottom port microphone package whilst FIG. 3b illustrates the relative alignment in the case of a top port microphone package. An interposer member 220, or gasket, is provided between the port 40 of the package and the port 240 of the device cover. The interposer member provides a sealed longitudinal channel between the two ports allowing acoustic pressure waves that enter the sound port of the device to travel into the MEMS microphone package for detection.

Figure 4:
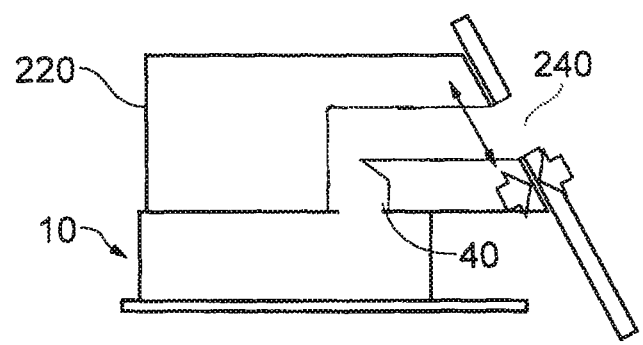
FIG. 4 illustrates a lack of alignment between a sound port of a microphone package and the sound port of a host device.

FIG. 4 illustrates a prior arrangement in which there is no alignment between the sound port 40 of the microphone package and the sound port 240 of the device cover. Thus, a tortuous or non-straight path is defined between the two ports. In this case an interposer member 220 comprises a channel having first and second portions, wherein the second portion extends at an angle relative to the first portion. In other words, the channel defined by the interposer member 229 comprises a bend. A number of difficulties may arise in this arrangement, In particular there is a risk of inadequate sealing pressure between the device cover and the interposer member. This potentially allows incoming pressure waves to leak around the gasket rather than progressing to the microphone package for detection. There is also a risk of the interposer becoming deformed and/or displaced with respect to its intended position. Furthermore, there is also a risk that the interposed may fold or collapse.

Figure 5:
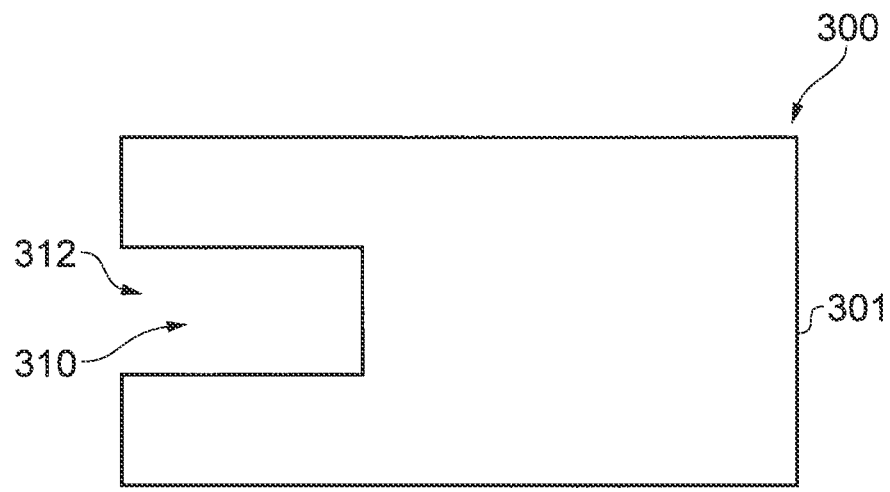
FIG. 5 illustrates a plan view of a substrate layer according to a first example.

FIG. 5 illustrates a plan view of a substrate layer 300 according to a first example. The substrate layer can be considered to be generally planar in form and to exhibit a boundary shape that is defined by a boundary edge 301. The boundary edge 301 defines a recess 310. The recess extends in the plane of the substrate layer from a mouth region 312. The recess can be considered to extend in a direction that is in plane with, or parallel to, the plane of the package substrate 300. If the substrate 300 is considered to define a horizontal plane, then the recess can be considered to extend in a horizontal direction.

In this example the recess is generally rectangular in shape. However, it will be appreciated that the shape of the recess is not critical and that any shape of recess may be provided or designed to suit the particular scenario.

Figure 6:
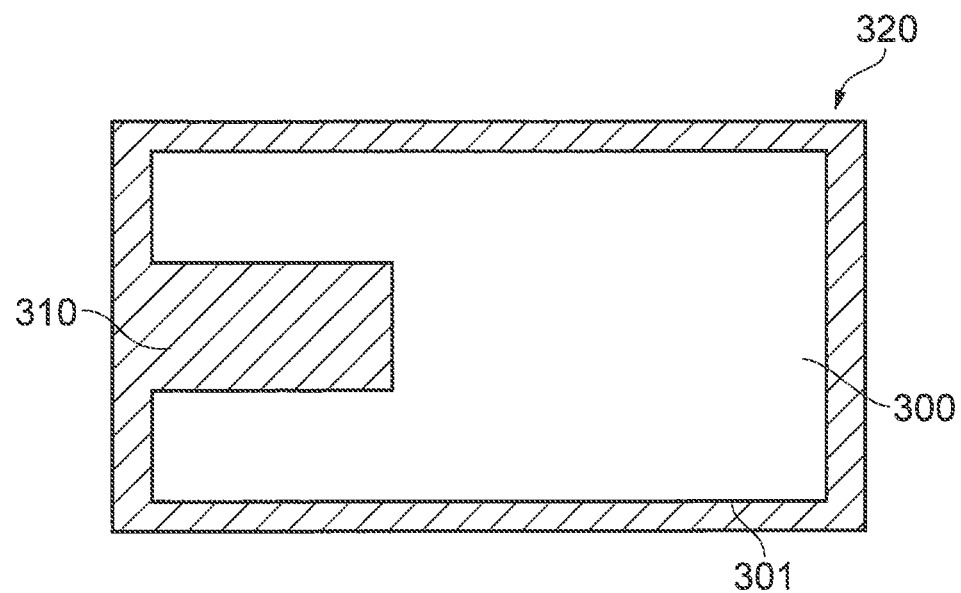
FIG. 6 illustrates a plan view of a base substrate according to one example.

FIG. 6 illustrates a plan view of a base substrate 320 according to one example. In this example a substrate layer 300 is provided on an upper surface of the base substrate 320. The base substrate 320 may comprise, e.g. a layer of printed circuit board (PCB). Thus, during a process of fabricating the substrate layer 300, a moulding technique may be employed. Specifically, a moulding tool may be positioned relative to the base substrate 320 to define the boundary of the intended substrate layer. A moulding substance is applied to the interior vacant region defined by the moulding tool. The moulding substance is preferably a settable material such as an epoxy resin which may be applied in fluid form and allowed to harden or set in order to form a solid, moulded substrate layer 300. The setting of the moulding substance may be achieved or accelerated by a process of curing.

Figure 7:
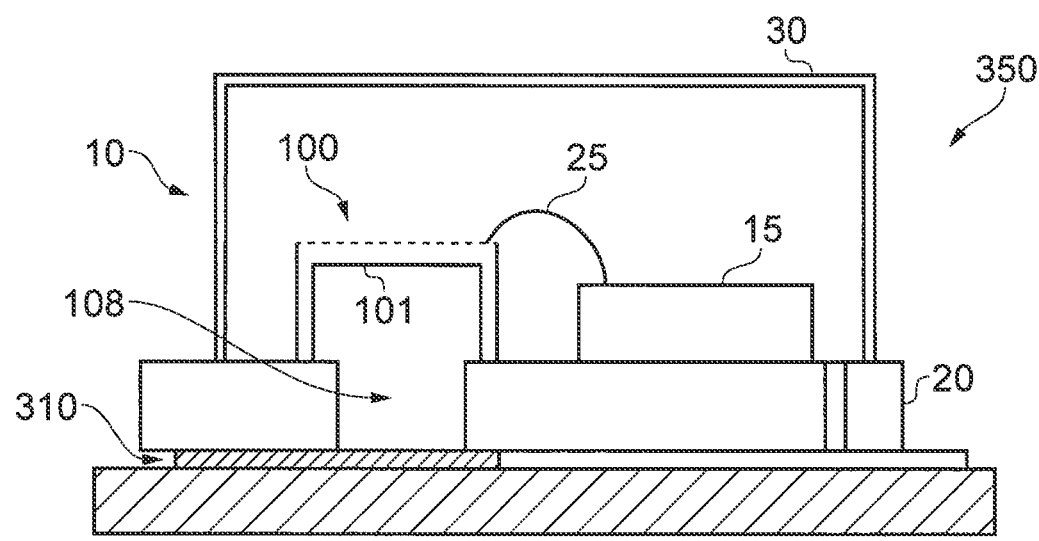
FIG. 7 illustrates a package assembly comprising a base substrate provided in conjunction with a MEMS transducer package.

As illustrated in FIG. 7, a base substrate 320 with substrate layer 300 such as illustrated in FIG. 6, may be provided in conjunction with a MEMS transducer package 10 in order to form a package assembly. The MEMS transducer package 10 comprises a MEMS transducer 100 mounted on the upper surface of a package substrate 20 so as to overly a cavity 108 formed through the package substrate 20. In this example an application specific integrated circuit (ASIC) 15 is also mounted to the upper surface of the package substrate and a lid 30 encloses both the MEMS transducer 100 and the ASIC 15 within a chamber defined by the lid. The recess 310 of the substrate layer 300 extends from a mouth region 312 which underlies a region at the side of the package substrate 20 to a region underlying the transducer package cavity 108. It will be appreciated that FIG. 7 is a cross-sectional view through a line which passes through the recess. For the purposes of illustration the out of plane portion of the substrate layer 300 is shown with cross-hatching. It will be appreciated that the recess 310 will define a channel which extends in the plane of the substrate layer 300. The channel is effectively closed on three sides by the boundary 301 of the substrate layer 300 and also by overlying and underlying surfaces that are provided by the lower side surface of the transducer package substrate 20 and by the upper surface of the base substrate 320 respectively. Thus, the channel provides a conduit or passage for sound waves incident on the mouth 312 of the channel to be directed towards the front side of the flexible membrane 101 of the transducer 100. The mouth 312 can be considered to define a sound port of the transducer package assembly.

An external contact (not shown) may be provided on the lid 30 of the package or on the underside of the base substrate 320 and an electrical path provided from the ASIC 15 to the external contact. It will be appreciated that the electrical path may be provided by means of one or more of electrical wire(s), metal via(s) formed in either or both of the package substrate 20 and the base substrate 320, and redistribution layers (RDLs) formed on the upper and/or lower surfaces of the substrate layer 300.

According to the arrangement shown in FIG. 7 the sound port of the package is thus located at a side surface of the package assembly. As such, the package may be particularly beneficial for use in circumstances where there is a need to direct or channel sound waves towards the flexible membrane of the transducer from a region laterally adjacent the package when mounted in a host device.

Figure 8:
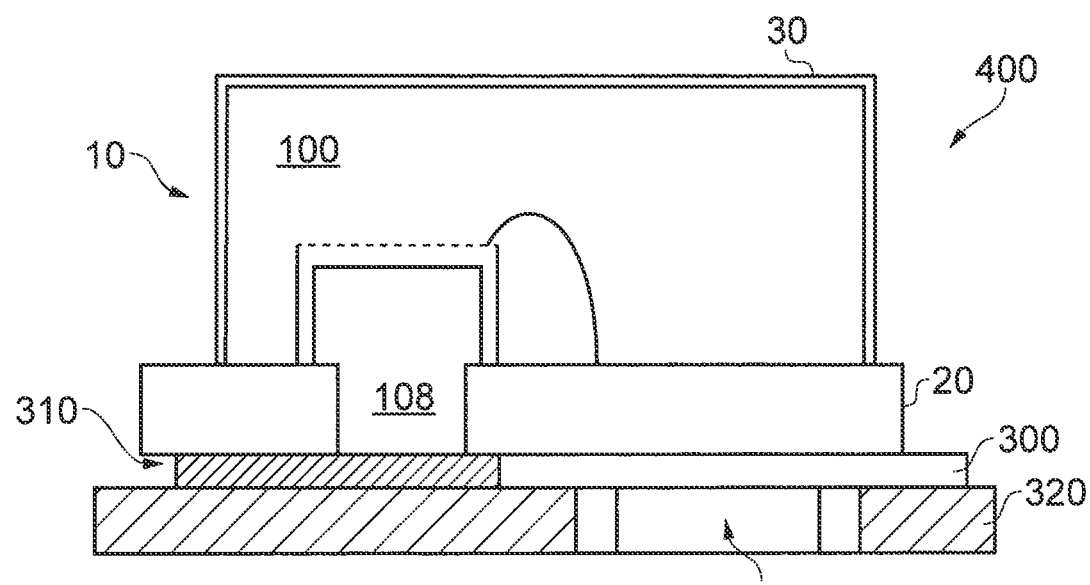
FIG. 8 illustrates a package assembly according to a further example.

It will be appreciated that there may be an additional need to reduce the height of the transducer package in scenarios where the package is to be mounted in a device where limited headroom is available. FIG. 8 illustrates a package assembly 400 which is similar to the package assembly illustrated in FIG. 7 except that the integrated circuitry chip or ASIC 15 is provided in the plane of the base substrate 320. Thus, the integrated circuitry chip is at least partially provided between the upper and lower surfaces of the base substrate. This arrangement beneficially frees up volume within the package chamber, thereby increasing the back volume of the transducer and/or allowing for the lid height to be reduced.

A method of fabricating a base substrate for a MEMS transducer package according to one example will now be described with reference to FIG. 9. It should be noted that, for ease, the referenced Figures show a single unit. However, in practice one or more of the present examples will advantageously involve the fabrication of multiple packages at one time, for example as an array or batch of units. It will also be appreciated that multiple intermediate products arise during the fabrication process and that the present examples extend to those intermediate products.

Figure 9A:
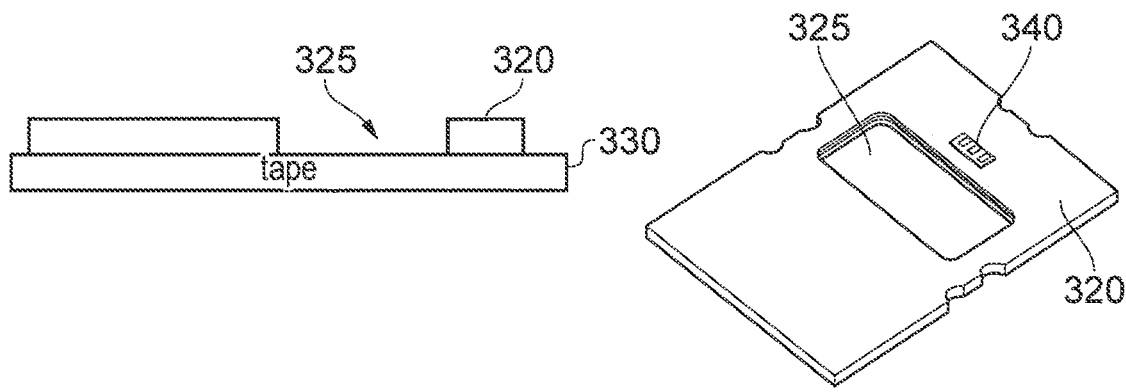

FIG. 9a provides a cross-sectional view as well as upper elevational view of a base substrate 320 which is provided on a supporting tape 330. The base substrate will form a base substrate according to the present examples and comprises a cavity 325 which extends through the PCB from an opening in the upper surface to an opening in the lower surface. The base substrate 320 is provided with three electrical contacts 340 which are intended for ground, in signal and out signal in the final transducer package.

Figure 9B:
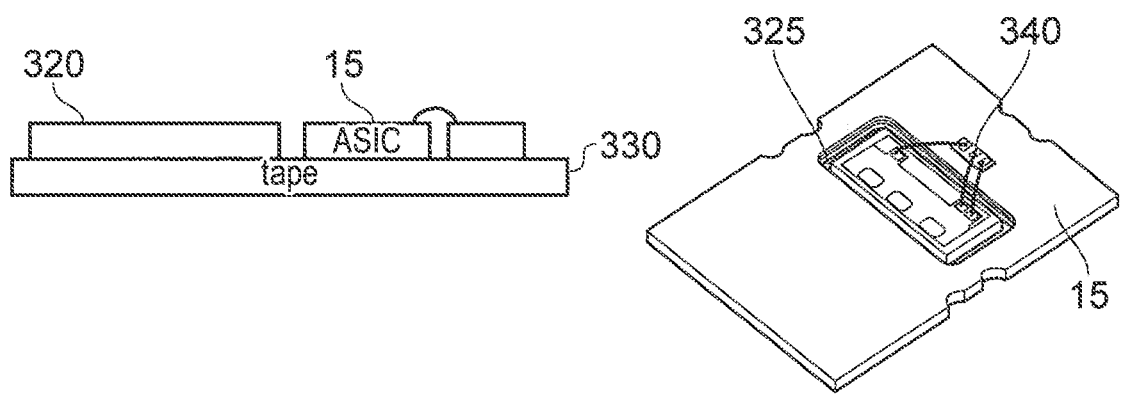

FIG. 9b illustrates an ASIC 15 positioned within the cavity 325 of the PCB and electrically connected to the electrical contacts 340 by means of metal wires.

Figure 9C:
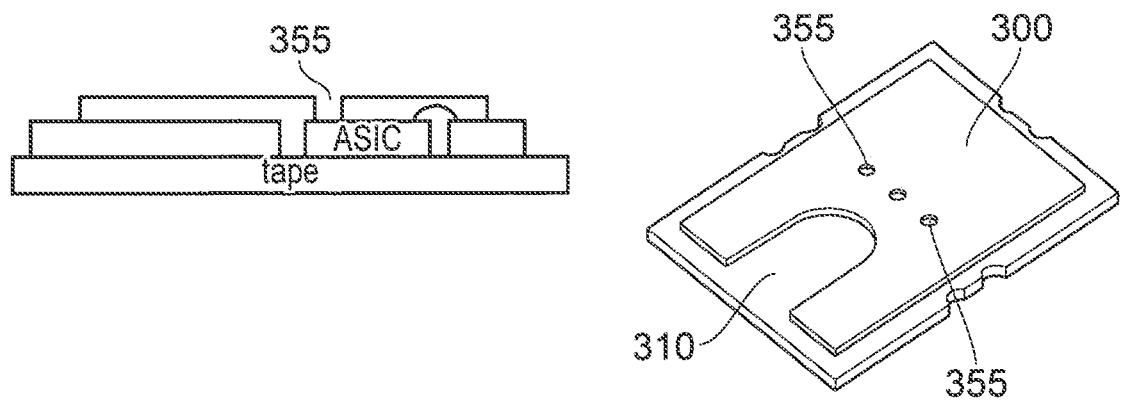

FIG. 9c illustrates the formation of the substrate layer 300 from a fluid moulding substance. For example, a moulding tool (not shown) is applied to the upper surface of the base substrate 320 and serves to delimit a region where the moulding substance is not desired, thus leaving a vacant region where the moulding material is desired. In particular, the moulding tool defines a generally planar layer in the region directly above the base substrate 320 and also delimits the intended recess of the substrate layer. The moulding tool may also define three intra-planar vias 355 for facilitating an electrical path between the ASIC 15 and the region directly above the substrate layer 300. When the moulding material is applied to the space defined by the moulding tool, it will flow into the region between the ASIC and the wall(s) of the cavity wall, thus defining a connecting frame which connects the ASIC to the PCB substrate. The moulding material will also define the substrate layer 300. When the moulding material has set it will be connected to the interfacing surfaces of the base substrate 320.

Figure 9D:
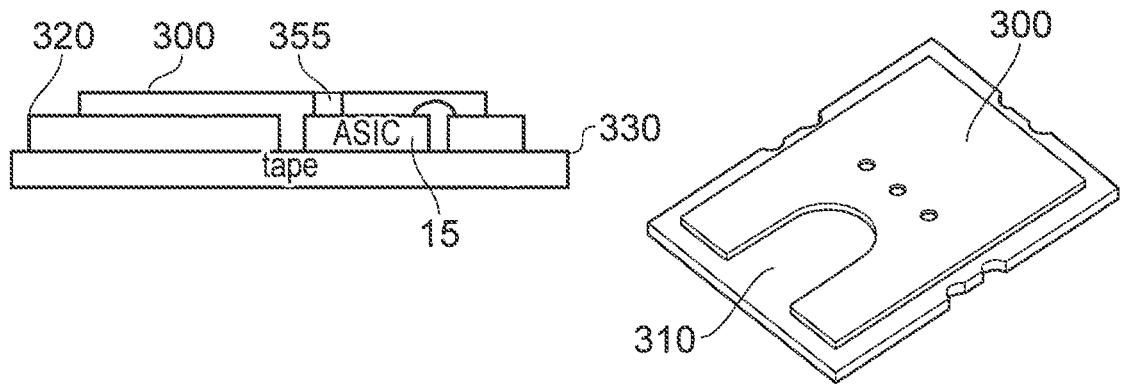
Figure 9E:
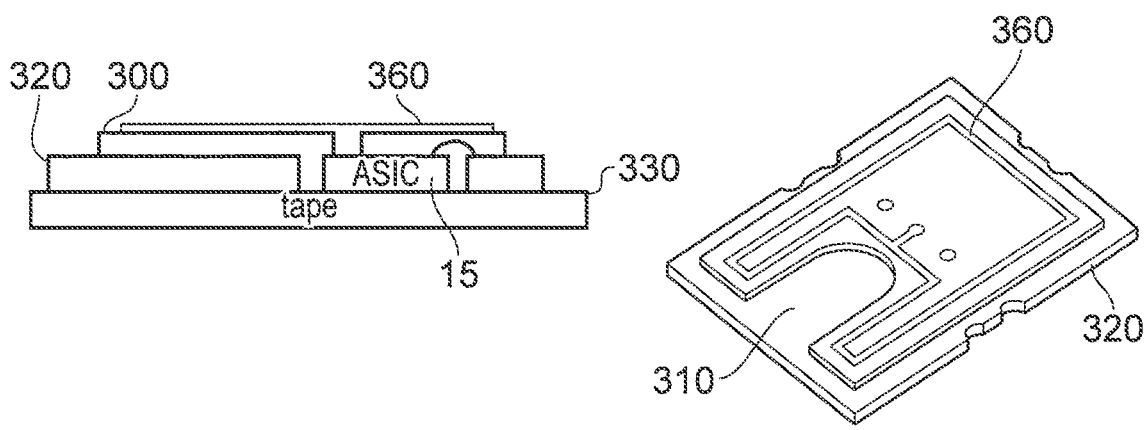
Figure 9F:
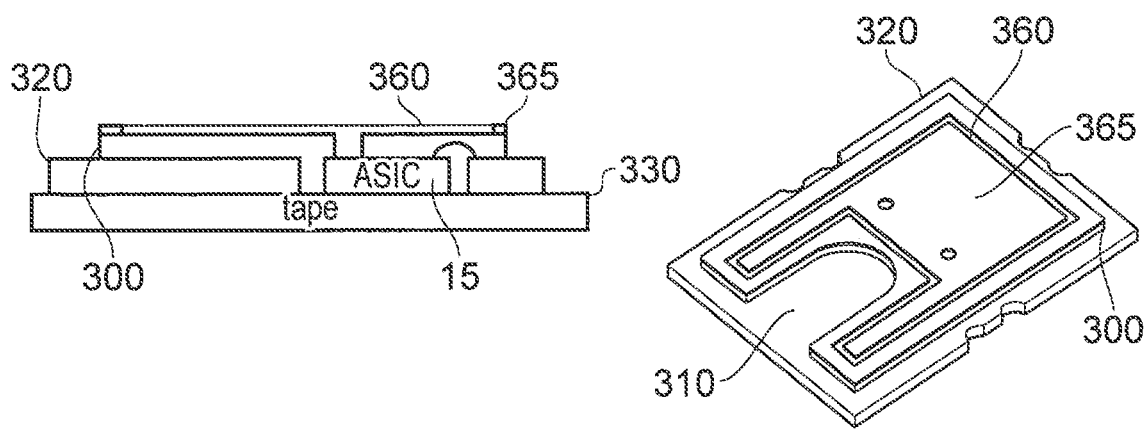

FIG. 9d illustrates the processing of metal plating the vias 355, whilst FIG. 9e illustrates the step of providing a conductive redistribution layer 360 on the upper surface of the substrate layer 300. As illustrated in FIG. 9f, a passivation layer 365 is applied to the upper surface of the substrate layer, avoiding the region 360 where the RDL has been applied. In a subsequent step (not shown) the tape 330 may be removed.

FIG. 10 illustrates a simplified method of fabricating a MEMS transducer package 10. Specifically, in FIG. 10a a package substrate 20 is provided. The package substrate comprises a cavity 108. As illustrated in FIG. 10b a MEMS microphone transducer 100 is mounted on the upper surface of the package substrate 20 such that the flexible membrane 101 overlies the cavity 108. Electrical connections are made between the MEMS transducer 100 and electrical contacts provided on the package substrate 20. The package substrate may be PCB or may be formed of a semiconductor material such as silicon. As illustrated in FIG. 10c a metal lid is mounted on the package substrate 20 so as to enclose the MEMS transducer 100 and form the MEMS transducer package 10.

In a subsequent processing stage, the MEMS transducer package 10 illustrated in FIG. 10c is mounted e.g. by a process of soldering, to the upper surface of the base substrate 320 which is illustrated in FIG. 9f. Various view of the resultant package are provided in FIG. 11.

FIG. 12 illustrates a transducer package 600 mounted in a host device. A portion of the cover 660 of the device is illustrated, the cover comprising an acoustic port 640. The transducer package comprises a package substrate 20 having a substrate layer 300 formed in a plane underlying the package substrate. The substrate layer comprises a recess 310. Sound waves incident on the exterior of the host device and in the vicinity of the sound port 640 will enter the interior of the host device. A sealing member 730 which may comprise a single portion or multiple components is provided to ensure that the sound waves do not leak around the transducer package but are instead channelled into the front volume of the MEMS transducer by the recess 310 in conjunction with the upper and lower abutting surfaces of the base substrate 320 and the package substrate 20 respectively. The sealing member can be considered to be an interposer member or gasket.

There are a number of advantages associated with this arrangement wherein the sound port of the transducer package is located at a side surface of the package substrate. In particular, the need to provide a complex, e.g. non-longitudinal, interposer member between the sound port of the device cover and the sound port of the package is obviated. Instead, a simple interposer defining a longitudinal channel may be provided. The substrate channel thus provides an effective solution for channelling sound waves from a region laterally adjacent the package to the underside of the flexible membrane.

One or more MEMS transducers according to the examples described here may be located within a package. This package may have one or more sound ports. A MEMS transducer according to the examples described here may be located within a package together with a separate integrated circuit comprising readout circuitry which may comprise analogue and/or digital circuitry such as a low-noise amplifier, voltage reference and charge pump for providing higher-voltage bias, analogue-to-digital conversion or output digital interface or more complex analogue or digital signal processing.

It is noted that the example embodiments described above may be used in a range of devices, including, but not limited to: analogue microphones, digital microphones, pressure sensors or ultrasonic transducers. The example embodiments may also be used in a number of applications, including, but not limited to, consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment.

Associated methods of fabricating a MEMS transducer package, a channel member a package substrate and a wafer product are respectively provided.

It should be understood that the various relative terms above, below, upper, lower, top, bottom, underside, overlying, underlying, beneath, etc. that are used in the present description should not be in any way construed as limiting to any particular orientation of the transducer during any fabrication step and/or its orientation in any package, or indeed the orientation of the package in any apparatus. Thus the relative terms shall be construed accordingly.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps.

Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A MEMS transducer package comprising:
   a package substrate comprising a cavity which is formed through the package substrate from an upper surface to a lower surface thereof;
   a substrate layer which underlies the package substrate, wherein a boundary edge of the substrate layer defines a recess which extends in the plane of the substrate layer and wherein the cavity overlies the recess; and
   a base substrate which underlies the package substrate, the substrate layer being provided on the base substrate, wherein the base substrate comprises an aperture which extends from an upper surface of the base substrate to the lower surface of the base substrate and wherein an integrated circuitry chip is provided within the aperture.

2. A MEMS transducer package as claimed in claim 1, wherein an upper surface of the substrate layer is provided in contact with the lower surface of the package substrate and wherein a lower surface of the substrate layer is provided in contact with an upper surface of the base substrate.

3. A MEMS transducer package as claimed in claim 1, wherein a channel is defined by:
   i) the portion of the boundary of the substrate layer which defines the recess;
   ii) the lower surface of the package substrate; and
   iii) the upper surface of the base substrate.

4. A MEMS transducer package as claimed in claim 1, wherein the recess extends from a mouth region of the recess in a first direction and wherein the mouth region defines a sound port of the transducer package.

5. A MEMS transducer package as claimed in claim 4, wherein the sound port is provided at a side surface of the transducer package.

6. A MEMS transducer package as claimed in claim 1, further comprising a MEMS microphone transducer provided on the upper surface of the package substrate, wherein the MEMS microphone transducer comprises a flexible membrane which deflects in response to a pressure differential across the membrane, and wherein the MEMS microphone transducer is provided such that the flexible membrane overlies the cavity of the package substrate.

7. A MEMS transducer package as claimed in claim 6, further comprising electronic circuitry, wherein the electronic circuitry comprises an integrated circuitry chip and wherein the integrated circuitry chip is provided on the upper surface of the package substrate.

8. A MEMS transducer package as claimed in claim 1, wherein the integrated circuitry chip is connected to the base substrate by a connecting frame which is formed between the outer boundary of the integrated circuitry chip and the side wall(s) of the aperture.

9. A MEMS transducer package as claimed in claim 1, further comprising a first electrically conductive path between the integrated circuitry chip and the upper surface of the substrate layer.

10. A MEMS transducer package as claimed in claim 9, further comprising a second electrically conductive path between the upper surface of the substrate layer and the MEMS transducer.

11. A MEMS transducer package as claimed in claim 1, further comprising a lid portion, the lid portion being provided on the upper surface of the package substrate to define a chamber.

12. A MEMS transducer package as claimed in claim 11, wherein the lid portion is formed of metal.

13. A base substrate comprising a substrate layer formed on an upper surface of the base substrate, a boundary edge of the substrate layer defining a recess which extends in the plane of the substrate layer, wherein the base substrate further comprises an aperture which extends from an upper surface of the base substrate to the lower surface of the base substrate, and wherein a circuitry chip is provided within the aperture.

14. A base substrate as claimed in claim 13, wherein the circuitry chip is connected to the base substrate by a connecting frame which is formed between the outer boundary of the integrated circuitry chip and the side wall(s) of the aperture.

15. A base substrate as claimed in claim 13, formed of a printed circuit board (PCB).

16. An electronic device comprising a MEMS transducer package as claimed in claim 1.

17. An electronic device as claimed in claim 16, wherein the device comprises a cover, the cover being provided with a sound port and wherein the MEMS transducer package is mounted within the electronic device such that an orthogonal projection of the mouth region of the recess defined by the substrate layer coincides with sound port.

* * * * *